United States Patent

Saito et al.

[11] Patent Number: 5,999,066
[45] Date of Patent: Dec. 7, 1999

[54] INTERFACE MODULE FOR A SENDING SECTION AND A RECEIVING SECTION

[75] Inventors: Hideaki Saito; Hitoshi Sasanuma; Katsuhito Nakajima; Yorio Komine, all of Tsurugashima, Japan

[73] Assignee: Toko Kabushiki Kaisha, Tokyo, Japan

[21] Appl. No.: 08/924,132

[22] Filed: Sep. 5, 1997

[30] Foreign Application Priority Data

Sep. 6, 1996 [JP] Japan .................................. 8-257662
Oct. 31, 1996 [JP] Japan .................................. 8-307399

[51] Int. Cl.$^6$ ........................................................ H03H 7/46
[52] U.S. Cl. ............................ 333/132; 333/175; 333/185
[58] Field of Search ..................................... 333/126, 129, 333/132, 134, 175, 185

[56] References Cited

U.S. PATENT DOCUMENTS

| | | |
|---|---|---|
| 3,872,399 | 3/1975 | Friberg et al. ........................... 333/185 |
| 4,453,144 | 6/1984 | Tamura et al. ........................ 333/185 X |
| 4,701,726 | 10/1987 | Holdsworth ............................... 333/185 |
| 5,036,301 | 7/1991 | Takao et al. ......................... 333/246 X |
| 5,793,265 | 8/1998 | Spielman ............................. 333/175 X |

*Primary Examiner*—Benny Lee
*Attorney, Agent, or Firm*—Pillsbury Madison & Sutro

[57] ABSTRACT

An interface module having a receiving section and a sending section, the receiving section being provided with a low pass filter, an isolation transformer and a common mode choke transformer, and the sending section is provided with a low pass filter, an isolation transformer and a common mode choke transformer and they are integrated with each other, wherein the receiving section and the sending section are independently formed on a board of the interface module, and the low pass filter at the receiving section and the low pass filter at the sending section are respectively covered by shield cases.

11 Claims, 6 Drawing Sheets

(PRIOR ART)

INTERFACE MODULE FOR A SENDING SECTION AND A RECEIVING SECTION

BACKGROUND OF THE INVENTION

1. Field of the Invention

The present invention relates to an interface module, and more particularly to an interface module used to transmit a digital signal in a communication between LANs (Local Area Networks), computers, data terminals or the like.

2. Description of the Related Art

Figure 9:
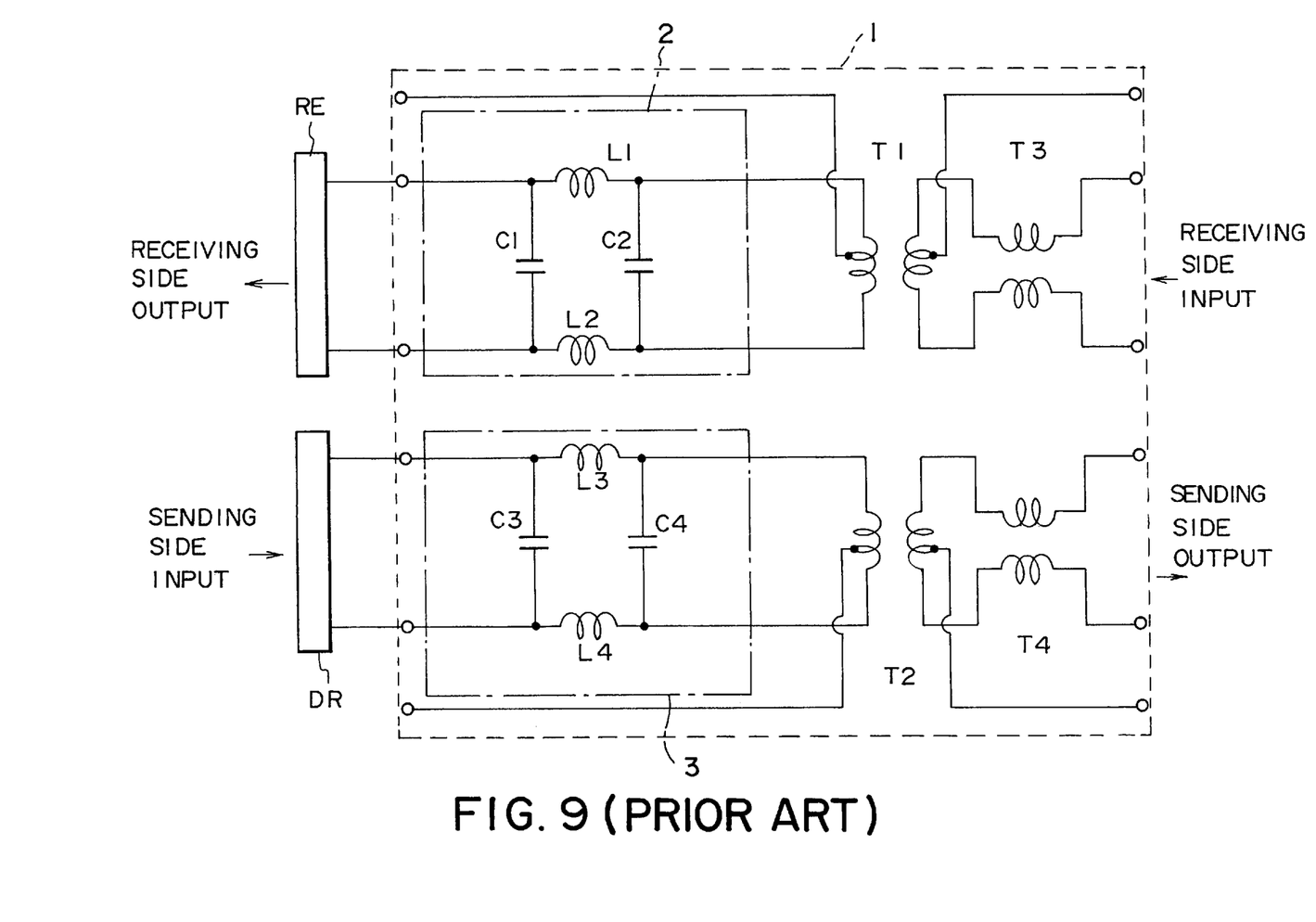
FIG. 9 is a circuit diagram showing a conventional interface circuit.

FIG. 9 is a circuit diagram showing a conventional interface circuit. A reference numeral 1 denotes a whole interface circuit. Reference numerals 2, 3 denote low pass filters. Reference numerals T1, T2 denote isolation transformers. Reference numerals T3, T4 denote common mode choke transformers. A reference symbol RE denotes a receiver. And, a reference symbol DR denotes a driver.

The whole interface circuit 1 is provided with a receiving slide, or section and a sending slide, or section. The receiving section is composed of the low pass filter 2, the isolation transformer T1 and the common mode choke transformer T3. The sending section is composed of the low pass filter 3, the isolation transformer T2 and the common mode choke transformer T4.

The low pass filter 2 removes noise (harmonic element) mixed on a transmission line. One end of a coil L1 and one end of a coil L2 are connected to each other through a capacitor C1. The other end of the coil L1 and the other end of the coil L2 are connected to each other through a capacitor C2. The low pass filter 3 removes harmonic element (noise at a normal mode). One end of a coil L3 and one end of a coil L4 are connected to each other through a capacitor C3. The other end of the coil L3 and the other end of the coil L4 are connected to each other through a capacitor C4.

The isolation transformers T1, T2 electrically separate between an input side and an output side (insulate between the input side and the output side). The common mode choke transformers T3, T4 remove common mode noises (noises having same phases on two lines).

An input signal on a receiving side input has a wave substantially identical to a sine wave, and is converted by the isolation transformer T1 after the common mode noise is removed by the common mode choke transformer T3. This signal is outputted to the receiving side output via the receiver RE after the noise mixed on the transmission line is removed through the low pass filter 2.

An input signal on a sending side input is a digital signal having a rectangular wave outputted by the driver DR. Then, this signal is inputted to the low pass filter 3 at the sending section. The wave of the signal inputted to this low pass filter 3 becomes substantially identical to the sine wave, since the harmonic element is removed. This signal is transmitted through the isolation transformer T2 to the common mode choke transformer T4, and then the common mode noise is removed and the signal is outputted to the sending side output.

Figure 10:
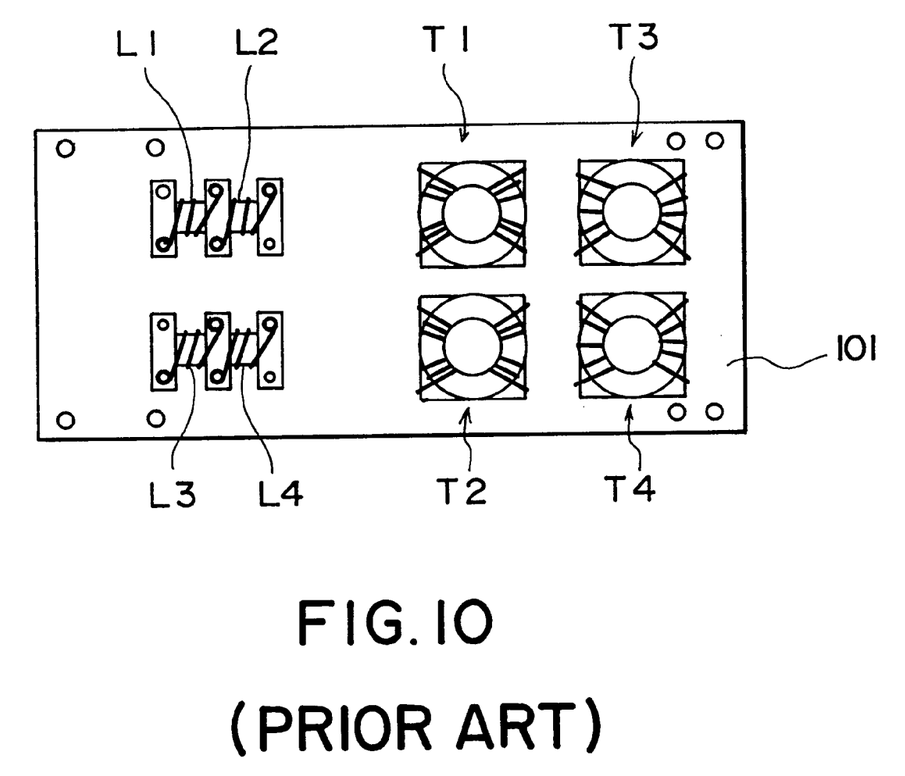
FIG. 10 is a top view of the conventional interface module.

Up to now, such an interface circuit is integrated as shown in FIG. 10. Namely, electronic parts, such as a bobbin around which coils L1, L2 of a low pass filter 2 are wound, a bobbin around which coils L3, L4 of a low pass filter 3 are wound, isolation transformers T1, T2, common mode choke transformers T3, T4 and the like are mounted on a front surface of a printed circuit board 101, and capacitors C1, C2, C3 and C4 (not shown in FIG. 10) of the low pass filters are mounted on a rear surface of the printed circuit board 101.

The interface module in which such an interface circuit is integrated is required to have an abrupt attenuation characteristic to attenuate signals not included in a predetermined frequency band because a fast response is necessitated.

In the conventional interface module, since the coils L1, L2, L3 and L4 constituting the low pass filter are formed in an open magnet circuit, an inputted signal having a high frequency is radiated as noise. Thus, in the conventional interface module, the noise radiated from the coil of the low pass filter is mixed into the isolation transformer or the common mode choke transformer, or the noise radiated from the coil of the one low pass filter is mixed into the other low pass filter. This results in a problem that it is impossible to obtain the sufficient attenuation characteristic.

In a case that other electronic parts which generate noise are mounted adjacently to the interface module, the external noise resulting from the electronic parts is mixed into the low pass filter, and thereby this results in the problem that it is impossible to obtain the sufficient attenuation characteristic. Moreover, in a case that the low pass filter 2 at the receiving section and the low pass filter 3 at the sending section are formed adjacently to each other, the coils L1, L2 constituting the low pass filter 2 and the coils L3, L4 constituting the low pass filter 3 at the sending section are electro-magnetically coupled to each other. Hence, this results in a problem that cross talk is generated.

In order to solve these problems, the low pass filter 2 at the receiving section, the low pass filter 3 at the sending section, the isolation transformers T1, T2 and the common mode choke transformers T3, T4 are formed so as to have intervals between them. However, this results in a problem that the size of the interface module becomes large. Moreover, even if having the above mentioned configuration, it is impossible to prevent the external noise from being mixed into the low pass filter. Hence, it is impossible to obtain the sufficient attenuation characteristic.

On the other hand, recently, it is desirable that such an interface module and the like are miniaturized, associated with the miniaturization of the apparatus comprising them. However, the conventional interface module can not be miniaturized because of the above mentioned problems.

SUMMARY OF THE INVENTION

It is therefore an object of the present invention to provide an interface module which can reduce the generation of cross talk and improve the attenuation characteristic even though it is miniaturized.

In the interface module of the present invent, each of a receiving section and a sending section is provided with a low pass filter, an isolation transformer and a common mode choke transformer, the receiving section and the sending section are independently formed on a board of the interface module, and the low pass filter at the receiving section and the low pass filter at the sending section are respectively covered by shield cases. In each of the low pass filters at the receiving section and the sending section, a plurality of coils are wound around one drum core, a plurality of capacitors connected to a plurality of coils are contained in a base mounting the drum core, and a plurality of coils and a plurality of capacitors are covered by the shield case. Accordingly, a balance type of a low pass filter is formed. The isolation transformer and the common mode choke transformer at the receiving section and the isolation transformer and the common mode choke transformer at the sending section are disposed between the low pass filter at the receiving section and the low pass filter at the sending section.

DETAILED DESCRIPTION OF THE PREFERRED EMBODIMENTS

The embodiments of the interface module of the present invention will be explained with reference to FIGS. 1 to 6.

Figure 1:
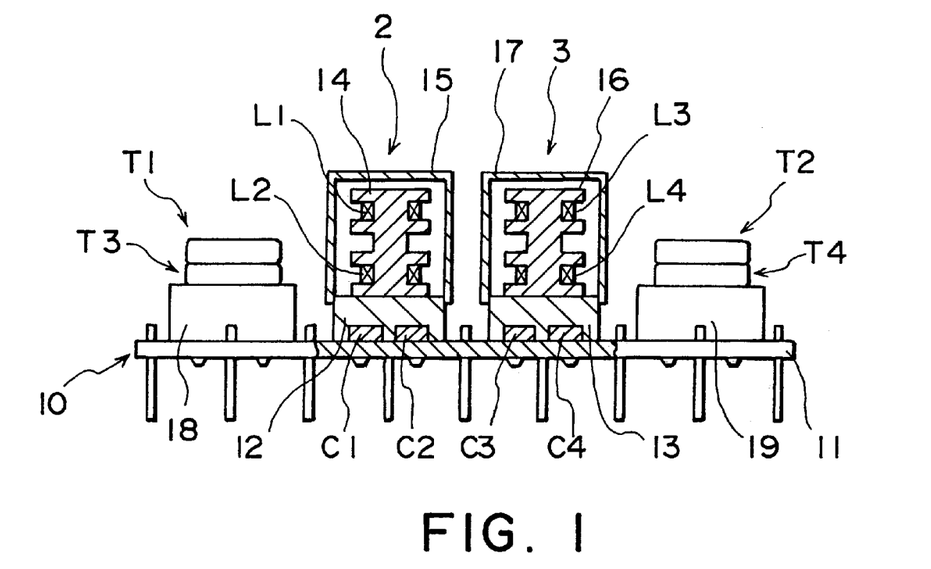
FIG. 1 is a partially sectional side view showing a first embodiment of an interface module of the present invention.
Figure 2:
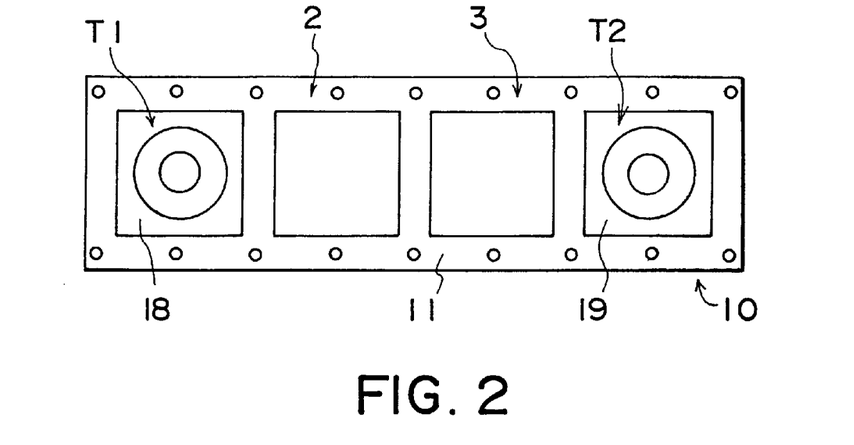
FIG. 2 is a top view of FIG. 1.

FIG. 1 is a partially sectional side view showing a first embodiment of the interface module of the present invention, and FIG. 2 is a top view of FIG. 1. A circuit of the type shown in FIG. 9 is mounted in this embodiment. Then, the parts corresponding to those in FIG. 9 are given similar reference numbers and symbols.

As shown in FIGS. 1 and 2, an interface module 10, the elements for constituting a receiving section including a low pass filter 2, an isolation transformer T1 and a common mode transformer T3, and the elements for constituting a sending section including a low pass filter 3, an isolation transformer T2 and a common mode transformer T4 are mounted on a surface of a printed circuit board 11 to be fixed thereto.

The low pass filter 2 at the receiving section is provided with coils L1, L2 and capacitors C1, C2. The coils L1, L2 are wound around a drum core 14 as described later. The drum core 14 is made of ferrite, and has four flanges and three wrap sections partitioned by these flanges. In the drum core 14, the coil L1 is wound around the wrap section on an upper side, and the coil L2 is wound around the wrap section on a lower side. The drum core 14 is adhered to a base 12 with an adhesive or the like. The base 12 having a plurality of terminals is made of synthetic resin. The coils L1, L2 wound around the drum core 14 are connected between predetermined terminals of the base 12, respectively. The capacitors C1, C2 are contained in the base 12. The drum core 14 around which the coils L1, L2 are wound and the capacitors C1, C2 are covered by a metallic case 15 engaged with the base 12. The metallic case 15 is formed by using a nickeled brass plate or a soldered copper plate. Then, one end of the coil L1 is connected through the capacitor C1 to one end of the coil L2. The other end of the coil L1 is connected through the capacitor C2 to the other end of the coil L2. Accordingly, a balance type of a low pass filter is formed.

The low pass filter 3 at the sending section has coils L3, L4 and capacitors C3, C4. The coils L3 and L4 are respectively wound around an upper and a lower wrap sections of a drum core 16 made of ferrite having three wrap sections, and the coils L3 and L4 are connected between predetermined terminals of a base made of synthetic resin. The capacitors C3, C4 are contained in the base 13 to which the drum core 16 is adhered. The coils L3, L4 and the capacitors C3, C4 are covered by a metallic case 17 engaged with the base 13. Then, one end of the coil L3 is connected through the capacitor C3 to one end of the coil L4. The other end of the coil L3 is connected through the capacitor C4 to the other end of the coil L4. Accordingly, a balance type of a low pass filter is formed.

The isolation transformers T1, T2 and the common mode choke transformers T3, T4 are respectively formed by using toroidal cores. Further, the isolation transformer T1 and the common mode choke transformer T3 at the receiving section are integrated with each other on a base 18. The isolation transformer T2 and the common mode choke transformer T4 at the sending section are integrated with each other on a base 19.

Figure 3:
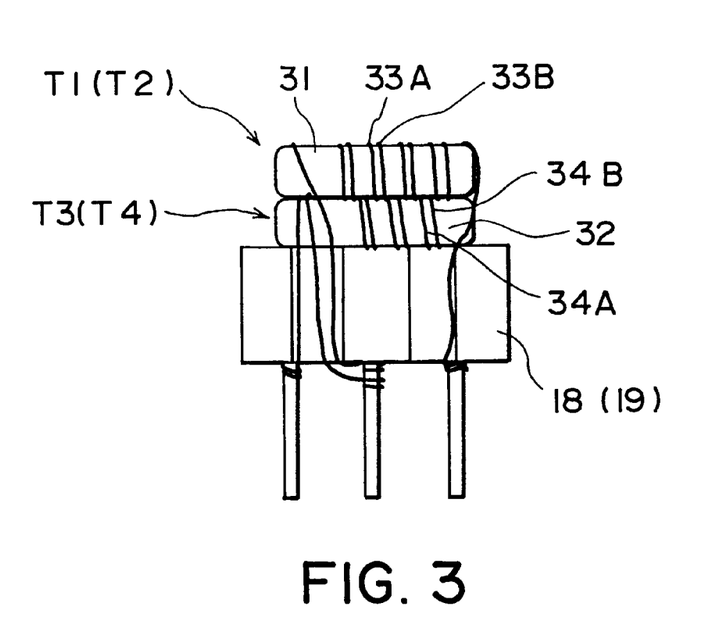
FIG. 3 is a side view of an isolation transformer and a common mode choke transformer in the interface module of the present invention.

As for the isolation transformer T1 and the common mode choke transformer T3, the isolation transformer T1 is formed such that a winding 33A and a winding 33B are bifilar-wound around a toroidal core 31 as magnified in FIG. 3, and the common mode choke transformer T3 is formed such that a winding 34A and a winding 34B are bifilar-wound around a toroidal core 32. In turn, these toroidal cores 31, 32 are stacked on and adhered to a substantial center of a surface of the base 18 made of synthetic resin at the condition that adhesives are respectively coated on bottom surfaces. A plurality of terminals are formed on a bottom surface of the base 18. The windings 33A, 33B wound around the toroidal core 31 and the windings 34A, 34B wound around the toroidal core 32 are connected between predetermined connecters of the base 18, respectively. The isolation transformer T1 and the common mode choke transformer T3 are connected to each other through these terminals.

In the isolation transformer T2 and the common mode choke transformer T4, the isolation transformer T2 is formed on the toroidal core 31 and the common mode choke transformer T4 is formed on the toroidal core 32, by using respectively two windings. In turn, these toroidal core 31 and the toroidal core 32 are stacked on a substantial center of a surface of the base 19 made of synthetic resin. The isolation transformer T2 and the common mode choke transformer T4 are connected to each other through a terminal of the base 19.

The low pass filter 2, the isolation transformer T1 and the common mode choke transformer T3 constituting the receiving section, and the low pass filter 3, the isolation transformer T2 and the common mode choke transformer T4 constituting the sending section are mounted at the condition that they are aligned along a longitudinal direction of the printed circuit board 11, in the order of the integrated isolation transformer T1 and common mode choke transformer T3, the low pass filter 2, the low pass filter 3, and the integrated isolation transformer T2 and common mode choke transformer T4, on one surface of the printed circuit board 11. As explained above, the circuit components for constituting the receiving section are integrated into a piece provided on a print circuit board and the circuit components for constituting the sending section are also integrated into a unit provided on a print circuit board so that wiring patterns of the print circuit boards of the receiving section and the sending section do not overlap each other in a complicated manner. Namely, the elements for constituting the receiving section including the low pass filter 2 and the integration of the isolation transformer T1 and the common mode choke transformer T3 are collectively mounted on the left half of the printed circuit board 11, and the elements for constituting the sending section including the low pass filter 3 and the integration of the isolation transformer T2 and the common mode transformer T4 are collectively mounted on the right half of the printed circuit board 11.

In the interface module formed as mentioned above, the low pass filter 2 at the receiving section and the low pass filter 3 at the sending section are covered by the metallic cases, respectively. Hence, the magnetic flux of the coil and the noise radiated from the coil are never leaked out from the case, and the external noise is never inputted into the case. Namely, in each of the low pass filters, the two coils are wound around the respective wrap sections which are separated by the central wrap section of the drum core made of ferrite, and are covered by the metallic case. Thus, magnetic paths are respectively formed in the case for the magnetic fluxes from the two coils, which are wound around the respective wrap sections. As a result, noises from the coils and outside are attenuated. As a result, even if the low pass filter 2 at the receiving section and the low pass filter 3 at the sending section are mounted adjacently to each other on the printed circuit board 11, the coils constituting the low pass filter 2 at the receiving section and the coils constituting the low pass filter 3 at the sending section are never electromagnetically coupled to each other, and the noise radiated from the coil of the one low pass filter is never mixed into the other low pass filter. Moreover, even if the low pass filter and the integrated isolation transformer and common mode choke transformer are mounted adjacently to each other on the printed circuit board 11, the noise radiated from the coil of the low pass filter is never mixed into the isolation transformers T1, T2 and the common mode choke transformers T3, T4.

Furthermore, the isolation transformer and the common mode choke transformer are integrally stacked on the base. Hence, it is possible to reduce the areas occupied by the isolation transformer and the common mode choke transformer at the receiving section and the isolation transformer and the common mode choke transformer at the sending section on the printed circuit board 11.

Figure 4:
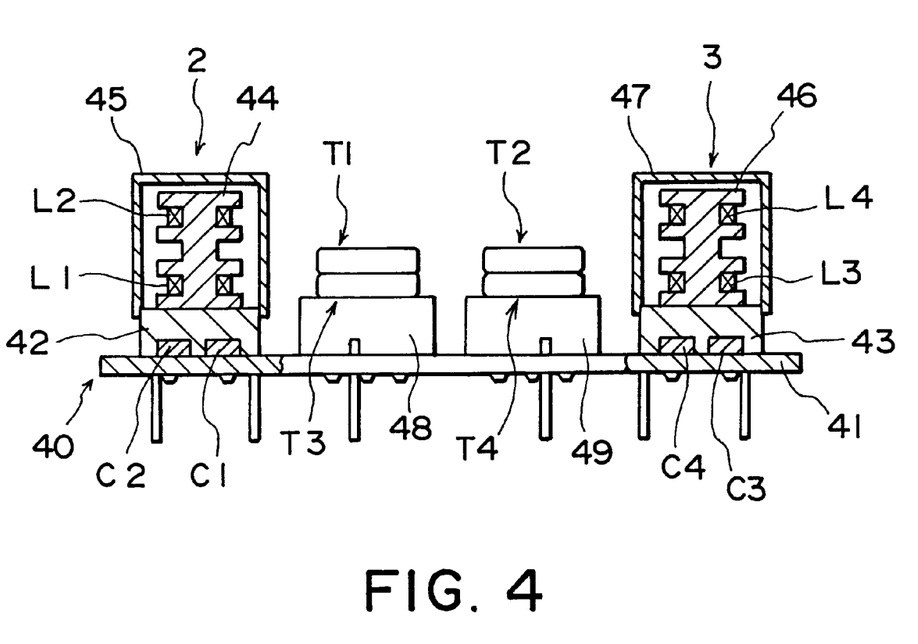
FIG. 4 is a partially sectional side view showing a second embodiment of the interface module of the present invention.
Figure 5:
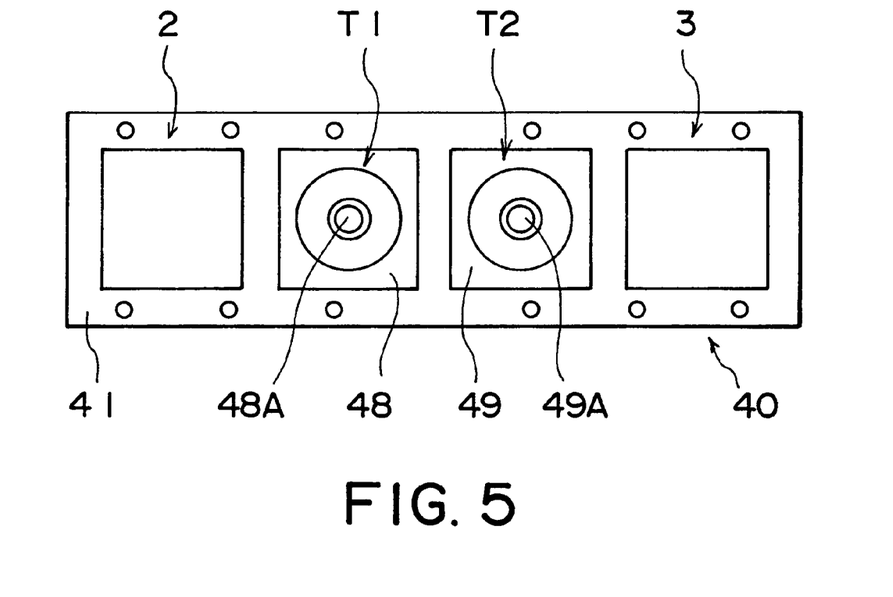
FIG. 5 is a top view of FIG. 4.

FIG. 4 is a partially sectional side view showing a second embodiment of the interface module of the present invention, and FIG. 5 is a top view of FIG. 4.

As shown in FIGS. 4 and 5, an interface module 40, a low pass filter 2, an isolation transformer T1 and a common mode choke transformer T3 constituting a receiving section, and a low pass filter 3, an isolation transformer T2 and a common mode choke transformer T4 constituting a sending section are integrally mounted on one surface of a printed circuit board 41 as described later.

In the low pass filter 2 at the receiving section, a coil L1 is wound around a wrap section on a lower side of a drum core 44 having three wrap sections, and a coil L2 is wound around a wrap section on an upper side. This drum core 44 is adhered to a base 42 made of synthetic resin in which capacitors C1, C2 are contained. The drum core 44 around which the coils L1, L2 are wound and the capacitors C1, C2 are covered by a metallic case 45, which is formed by using a nickeled brass plate or a soldered copper plate. Then, one end of the coil L1 is connected through the capacitor C1 to one end of the coil L2. The other end of the coil L1 is connected through the capacitor C2 to the other end of the coil L2. Accordingly, the balance type of the low pass filter is formed.

In the low pass filter 3 at the sending section, the coils L3, L4 are separately wound around the separated wrap sections of a drum core 46. This drum core 46 is adhered to a base 43 made of synthetic resin in which capacitors C3, C4 are contained. The coils L3, L4 and the capacitor C3, C4 are covered by a metallic case 47. Then, one end of the coil L3 is connected through the capacitor C3 to one end of the coil L4. The other end of the coil L3 is connected through the capacitor C4 to the other end of the coil L4. Accordingly, the balance type of the low pass filter is formed.

The isolation transformers T1, T2 are respectively formed such that two windings (not shown) are bifilar wound around a toroidal core. The common mode choke transformers T3, T4 are respectively formed such that two windings (not shown) are bifilar wound on a toroidal core. In turn, the toroidal core 61 of the isolation transformer T1 and the toroidal core 62 of the common mode choke transformer T3 are respectively inserted into convex portion 48A projecting from the substantial center of the upper surface of base 48 made of synthetic resin as magnified in FIG. 6, and are stacked on base 48. The toroidal core 61 of the isolation transformer T2 and the toroidal core 62 of the common mode choke transformer T4 are respectively inserted into convex portion 49A projecting from the substantial center of the upper surface of base 49 made of synthetic resin as magnified in FIG. 6, and are stacked on base 49. The two windings wound around the toroidal core 61 and the two windings wound around the toroidal core 62 are respectively connected between predetermined connecters disposed at the bases 48, (49). The isolation transformers T1, (T2) and the common mode choke transformers T3, (T4) are respectively connected to each other through these terminals.

The integrated isolation transformer T1 and common mode choke transformer T3 and the integrated isolation transformer T2 and common mode choke transformer T4 are mounted at the condition that they are aligned in the order of the low pass filter 2, the integrated isolation transformer T1 and common mode choke transformer T3, the integrated isolation transformer T2 and common mode choke transformer T4 and the low pass filter 3, along a longitudinal direction of the printed circuit board 41, so as to be put between the low pass filter 2 at the receiving section and the low pass filter 3 at the sending section, on one surface of the printed circuit board 41. In this way, the receiving section is formed on a left half of the printed circuit board 41, and the sending section is formed on a right half of the printed circuit board 41.

In the interface module of this embodiment, since the isolation transformer T1 and the common mode choke transformer T3 at the receiving section and the isolation transformer T2 and the common mode choke transformer T4 at the sending section are disposed between the low pass filter 2 at the receiving section and the low pass filter 3 at the sending section that are covered by the metallic cases, the external noise in the longitudinal direction of the printed circuit board 41 can be attenuated by the cases of the low pass filters. Hence, the isolation transformer and common mode choke transformer are respectively shielded from the external noise in the longitudinal direction of the printed circuit board 41.

Figure 6:
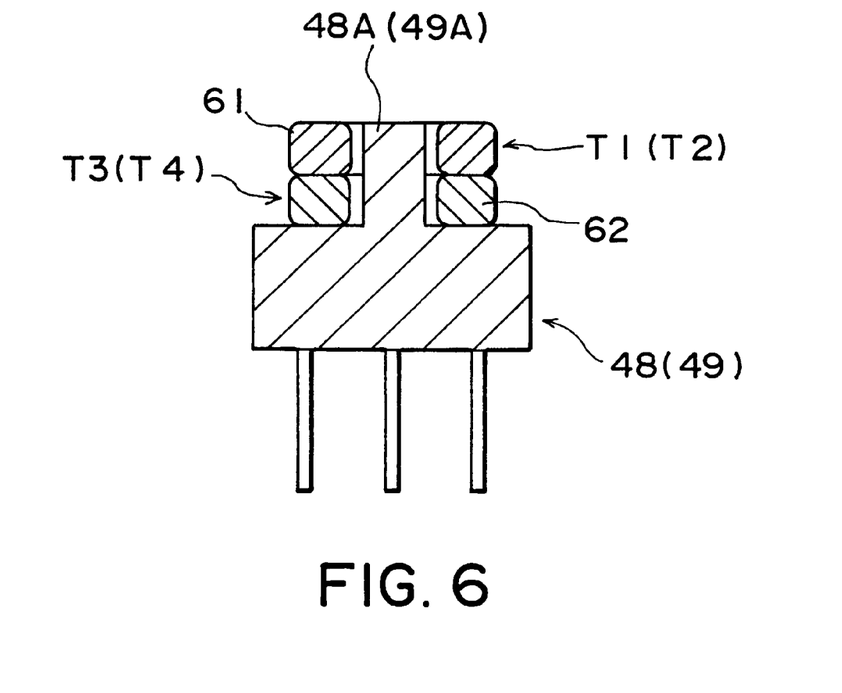
FIG. 6 is a sectional view of the isolation transformer and the common mode choke transformer in the interface module of the present invention.

Moreover, the base on which the isolation transformer and the common mode choke transformer are stacked has the convex portion at the substantial center of the surface of the base. Hence, it is easy to stacked the isolation transformer and the common mode choke transformer, and also easy to position the isolation transformer and the common mode choke transformer.

Figure 7:
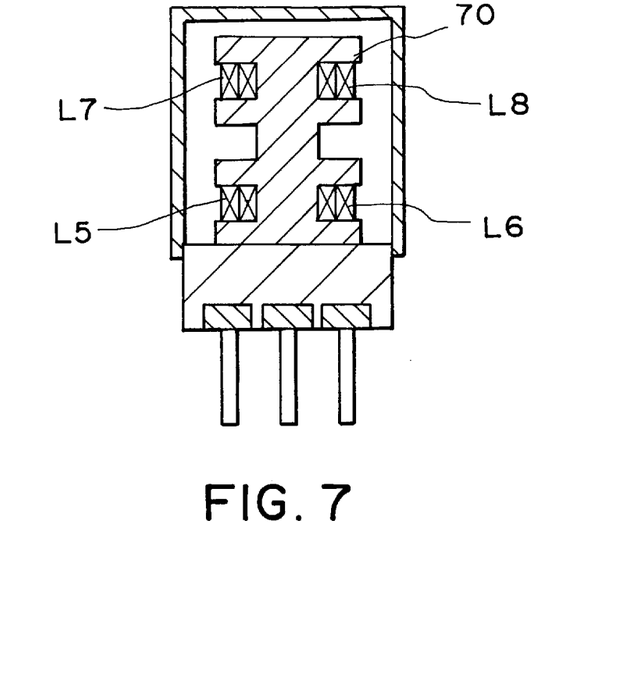
FIG. 7 is a sectional view of another low pass filter in the interface module of the present invention.
Figure 8:
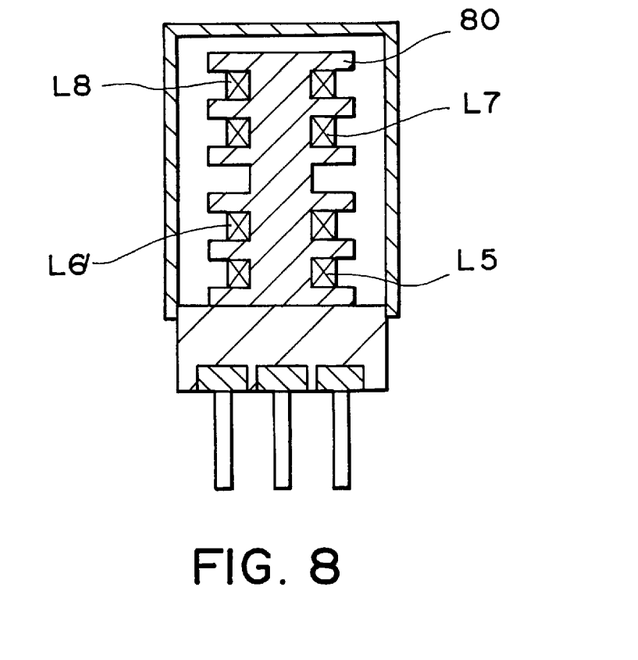
FIG. 8 is a sectional view of still another low pass filter in the interface module of the present invention.

Although the embodiments of the interface module of the present invention are described as mentioned above, the present invention is not limited to them. For example, the low pass filter may be constituted as shown in FIG. 7. Namely, two or more coils L5, L6 connected in series with each other are wound around a wrap section on a lower side of a drum core 70. Two or more coils L7, L8 connected in series with each other are wound around a wrap section on an upper side of the drum core 70. A plurality of coils wound around the wrap section on the upper side and a plurality of coils wound around the wrap section on the lower side are connected to each other through capacitors. Accordingly, the balance type of the low pass filter is formed. Or, the low pass filter may be constituted as shown in FIG. 8. Namely, two or more coils L5, L6 connected in series with each other are wound around separate wrap sections on a lower side of a drum core 80 having five or more wrap sections, and two or more coils L7, L8 connected in series with each other are wound around separate wrap sections on an upper side of the drum core 80, while a central wrap section thereof is put between the upper and lower wrap sections. A plurality of coils wound around the wrap section on the upper side and a plurality of coils wound around the wrap section on the lower side are connected to each other through capacitors. Accordingly, the balance type of the low pass filter is formed.

A pin type terminal or a metallic plate type terminal may be used for the terminal disposed on the base made of resin of the low pass filter or the terminal disposed on the base on which the isolation terminal and the common mode choke transformer are integrally formed. Moreover, the isolation transformer and the common mode choke transformer may be covered by a metallic case engaged with a base on which the isolation transformer and the common mode choke transformer are integrally formed. Furthermore, as for the low pass filters at the receiving section and the sending section, the drum core around which a plurality of coils are wound and a plurality of capacitors are attached to a metallic terminal, without using the base made of resin, and then the whole is sealed with resin material, and further may be covered by a metallic case.

As mentioned above, in the interface module of the present invention, the receiving section and the sending section are independently formed on the board of the interface module, and the low pass filters at the receiving section and the sending section are covered by the shield cases, respectively. Therefore, it is possible to reduce the generation of the cross talk and to improve the attenuation characteristic of the noise, even though the size is made small. Moreover, in the interface module of the present invention, the external noise mixed into the isolation transformer and the common mode choke transformer can be reduced by the case of the low pass filter, when the isolation transformer and the common mode choke transformer at the receiving section and the isolation transformer and the common mode choke transformer at the sending section are disposed between the low pass filter at the receiving section and the low pass filter at the sending section. Furthermore, the interface module of the present invention can be miniaturized, since a plurality of coils constituting the low pass filter and a plurality of the capacitors are integrally formed and the isolation transformer and the common mode choke transformer are also stacked and then integrally formed. In the interface module of the present invention, before being mounted on the printed circuit board, the receiving section and the sending section are divided in accordance with the functions, and then the performances can be adjusted, and further it is easy to mount the interface module on the printed circuit board.

Many widely different embodiments of the present invention may be constructed without departing from the spirit and scope of the present invention. It should be understood that the present invention is not limited to the specific embodiments described in the specification, except as defined in the appended claims.

What is claimed is:

1. An interface module having a receiving section and a sending section, said receiving section being provided with a low pass filter, an isolation transformer and a common mode choke transformer, and said sending section being provided with a low pass filter, an isolation transformer and a common mode choke transformer, wherein said receiving section and said sending section are independently formed on a board of said interface module, and said low pass filter of said receiving section and said low pass filter of said sending section are respectively covered by corresponding shield cases, and said isolation transformer and said common mode choke transformer of said receiving section and said isolation transformer and said common mode choke transformer of said sending section are disposed between said low pass filter of said receiving section and said low pass filter of said sending section.

2. An interface module having a receiving section and a sending section integrated with respect to each other and provided on a circuit board of said interface module, said receiving section including a low pass filter, an isolation transformer and a common mode choke transformer connected in a cascade connection manner, and said sending section including a low pass filter, an isolation transformer and a common mode choke transformer connected in a cascade connection manner;

said low pass filter of said receiving section having a first input terminal, a first output terminal, a second input terminal and a second output terminal, and comprising a first coil connected between said first input terminal and said first output terminal, a second coil connected between said second input terminal and said second output terminal, a first capacitor connected between said first input terminal and said second input terminal and a second capacitor connected between said first output terminal and said second output terminal;

said first and second coils being wound around respective wrap sections of a first ferrite drum core, said wrap sections being separated from each other by a central wrap section of said first ferrite drum core, said first and second coils and said first and second capacitors being connected to respective terminals, and said first and second coils and said first and second capacitors being sealed with resin and being covered with a first shield case, thereby constituting a balance type low pass filter of said receiving section;

said low pass filter of said sending section having a third input terminal, a third output terminal, a fourth input terminal and a fourth output terminal, and comprising a third coil connected between said third input terminal and said third output terminal, a fourth coil connected between said fourth input terminal and said fourth output terminal, a third capacitor connected between said third input terminal and said fourth input terminal and a fourth capacitor connected between said third output terminal and said fourth output terminal;

said third and fourth coils being wound around respective wrap sections of a second ferrite drum core, said wrap sections being separated from each other by a central wrap section of said second ferrite drum core, said third and fourth coils and said third and fourth capacitors being connected to respective terminals, and said third and fourth coils and said third and fourth capacitors being sealed with resin and being covered with a second shield case, thereby constituting a balance type low pass filter of said sending section;

said isolation transformer and said common mode choke transformer of said receiving section comprising a first toroidal core of said isolation transformer, a second toroidal core of said common mode choke transformer, and a first base having a plurality of terminals;

said first and second toroidal cores being stacked on said first base and being attached thereto, and said isolation transformer and said common mode choke transformer of said receiving section being connected through respective terminals of said first base and integrated together;

said isolation transformer and said common mode choke transformer of said sending section comprising a third toroidal core of said isolation transformer, a fourth toroidal core of said common mode choke transformer, and a second base having a plurality of terminals;

said third and fourth toroidal cores being stacked on said second base and being attached thereto, and said isolation transformer and said common mode choke transformer of said sending section being connected through respective terminals of said second base and integrated together; and said low pass filter of said receiving section, said isolation transformer and said common mode choke transformer of said receiving section, said low pass filter of said sending section and said isolation transformer and said common mode choke transformer of said sending section being provided on said circuit board of said interface module, with said receiving section and said sending section being separated from each other, thereby providing said receiving section and said sending section independently on said circuit board of said interface module.

3. An interface module of claim 2, wherein said isolation transformer and said common mode choke transformer of said receiving section, and said isolation transformer and said common mode choke transformer of said sending section are provided between said low pass filter of said receiving section and said low pass filter of said sending section on said circuit board of said interface module.

4. An interface module having a receiving section and a sending section integrated with respect to each other and provided on a circuit board of said interface module, said receiving section including a low pass filter, an isolation transformer and a common mode choke transformer connected in a cascade connection manner, and said sending section including a low pass filter, an isolation transformer and a common mode choke transformer connected in a cascade connection manner;

said low pass filter of said receiving section having a first input terminal, a first output terminal, a second input terminal and a second output terminal, and comprising a first coil which is composed of a plurality of coils connected together in series between said first input terminal and said first output terminal, a second coil which is composed of a plurality of coils connected together in series between said second input terminal and said second output terminal, and a plurality of first capacitors connected between said first coil and said second coil;

said first coil and said second coil being wound around respective wrap sections of a first ferrite drum core, said respective wrap sections being separated from each other by a central wrap section of said first ferrite core, said first coil and said second coil and said plurality of first capacitors being connected to respective terminals, and said first coil and said second coil and said plurality of first capacitors being sealed with resin and being covered with a first shield case, thereby constituting a balance type low pass filter of said receiving section;

said low pass filter of said sending section having a third input terminal, a third output terminal, a fourth input terminal and a fourth output terminal, and comprising a third coil which is composed of a plurality of coils connected together in series between said third input terminal and said third output terminal, a fourth coil which is composed of a plurality of connected together in series between said fourth input terminal and said fourth output terminal, and a plurality of second capacitors connected between said third and fourth coils;

said third and fourth coils being wound around respective wrap sections of a second ferrite drum core, said wrap sections being separated from each other by a central wrap section of said second ferrite drum core, said third and fourth coils and said plurality of second capacitors being connected to respective terminals, and said third and fourth coils and said plurality of second capacitors being sealed with resin and being covered with a respective shield case, thereby constituting a balance type low pass filter of said sending section;

said isolation transformer and said common mode choke transformer of said receiving section comprising a first toroidal core of said isolation transformer, a second toroidal core of said common mode choke transformer, and a first base having a plurality of terminals;

said first and second toroidal cores being stacked on said first base and being attached thereto, and said isolation transformer and said common mode choke transformer of said receiving section being connected through respective terminals of said first base to be integrated together;

said isolation transformer and said common mode choke transformer of said sending section comprising a third toroidal core of said isolation transformer, a fourth toroidal core of said common mode choke transformer, and a second base having a plurality of terminal;

said third and fourth toroidal cores being stacked on said second base and being attached thereto, and said isolation transformer and said common mode choke transformer of said sending section being connected through respective terminals of said second base to be integrated together; and said low pass filter of said receiving section, said isolation transformer and said common mode choke transformer of said receiving section, said low pass filter of said sending section and said isolation transformer and said common mode choke transformer of said sending section being provided on said circuit board of said interface module, with said receiving section and said sending section separated from each other, thereby providing said receiving section and said sending section independently on said circuit board of said interface module.

5. An interface module of claim 4, wherein said isolation transformer and common mode choke transformer of said receiving section, and said isolation transformer and said common mode choke transformer of said sending section are provided between said low pass filter of said receiving section and said low pass filter of said sending section on said circuit board of said interface module.

6. An interface module having a receiving section and a sending section, said receiving section being provided with a low pass filter, an isolation transformer and a common mode choke transformer, and said sending section being provided with a low pass filter, an isolation transformer and a common mode choke transformer, wherein said receiving section and said sending section are independently disposed on a board of said interface module;

in said low pass filter of said receiving section, a plurality of coils for said low pass filter of said receiving section are wound around a first drum core, a plurality of capacitors connected to said plurality of coils are contained in a first base which supports said first drum core, said plurality of coils and said plurality of capacitors are covered with a first shield case, and accordingly said low pass filter of said receiving section is configured as a balance type low pass filter;

in said low pass filter of said sending section, a plurality of coils for said low pass filter of said sending section are wound around a second drum core, a plurality of capacitors connected to said plurality of coils are contained in a second base which supports said second drum core, said plurality of coils and said plurality of capacitors are covered with a second shield case, and accordingly said low pass filter of said sending section is configured as a balance type low pass filter; and said isolation transformer and said common mode choke transformer of said receiving section and said isolation transformer and said common mode choke transformer of said sending section are disposed between said low pass filter of said receiving section and said low pass filter of said sending section.

7. An interface module according to claim 6, wherein said isolation transformer of said receiving section and said common mode choke transformer of said receiving section comprise a first toroidal core which forms said isolation transformer of said receiving section, a second toroidal core which forms said common mode choke transformer of said receiving section, and a third base having a plurality of terminals;

said first and second toroidal cores being stacked on said third base and being attached thereto, and said isolation transformer of said receiving section and said common mode choke transformer of said receiving section being connected through respective terminals of said third base and integrated together;

wherein said isolation transformer of said sending section and said common mode choke transformer of said sending section comprise a third toroidal core which forms said isolation transformer of said sending section, a fourth toroidal core which forms said common mode choke transformer of said sending section, and a fourth base having a plurality of terminals;

said third and fourth toroidal cores being stacked on said fourth base and being attached thereto, and said isolation transformer of said sending section and said common mode choke transformer of said sending section being connected through respective terminals of said fourth base and integrated together.

8. An interface module having a receiving section and a sending section integrated with respect to each other and provided on a circuit board of said interface module, said receiving section including a low pass filter, an isolation transformer and a common mode choke transformer connected in a cascade connection manner, and said sending section including a low pass filter, an isolation transformer and a common mode choke transformer connected in a cascade connection manner;

said low pass filter of said receiving section having a first input terminal, a second input terminal, a first output terminal and a second output terminal, and comprising a first coil connected between said first input terminal and said first output terminal, a second coil connected between said second input terminal and said second output terminal, a first capacitor connected between said first input terminal and said second input terminal and a second capacitor connected between said first output terminal and said second output terminal;

said first and second coils being wound around respective wrap sections of a first ferrite drum core, said respective wrap sections being separated from each other by a central wrap section of said first ferrite drum core, and said first capacitor and said second capacitor being enclosed in a first base which supports said first ferrite drum core;

said first and second coils, and said first and second capacitor being covered with a first shield case, thereby constituting a balance type low pass filter of said receiving section;

said low pass filter of said sending section having a third input terminal, a fourth input terminal, a third output terminal and a fourth output terminal, and comprising a third coil connected between said third input terminal and said third output terminal, a fourth coil connected between said fourth input terminal and said fourth output terminal, a third capacitor connected between said third input terminal and said fourth input terminal and a fourth capacitor connected between said third output terminal and said fourth output terminal;

said third and fourth coils being wound around respective wrap sections of a second ferrite drum core, said respective wrap sections being separated from each other by a central wrap section of said second ferrite drum core, and said third capacitor and said fourth capacitor being enclosed in a second base which supports said second ferrite drum core;

said third and fourth coils, and said third and fourth capacitors being covered with a second shield case, thereby constituting a balance type low pass filter of said sending section;

said isolation transformer and said common mode choke transformer of said receiving section comprising a first toroidal core of said isolation transformer, a second toroidal core of said common mode choke transformer, and a third base having a plurality of terminals;

said first and second toroidal cores being stacked on said third base and being attached thereto, and said isolation transformer and said common mode choke transformer of said receiving section being connected through respective terminals of said third base and integrated together;

said isolation transformer and said common mode choke transformer of said sending section comprising a third toroidal core of said isolation transformer, a fourth toroidal core of said common mode choke transformer, and a fourth base having a plurality of terminals;

said third and fourth toroidal cores being stacked on said fourth base and being attached thereto, and said isolation transformer and said common mode choke transformer of said sending section being connected through respective terminals of said fourth base and integrated together; and said low pass filter of said receiving section, said isolation transformer and said common mode choke transformer of said receiving section and said low pass filter of said sending section and said isolation transformer and said common mode choke transformer of said sending section being provided on said circuit board of said interface module, with said receiving section and said sending section being separated from each other, thereby providing said receiving section and said sending section independently on said circuit board of said interface module.

9. An interface module of claim 8, wherein said isolation transformer and said common mode choke transformer of said receiving section and said isolation transformer and said common mode choke transformer of said sending section are provided between said low pass filter of said receiving section and said low pass filter of said sending section on said circuit board of said interface module.

10. An interface module having a receiving section and a sending section integrated with respect to each other and provided on a circuit board of said interface module, said receiving section including a low pass filter, an isolation transformer and a common mode choke transformer connected in a cascade connection manner, and said sending section including a low pass filter, an isolation transformer and a common mode choke transformer connected in a cascade connection manner;

said low pass filter of said receiving section having a first input terminal, a second input terminal, a first output terminal and a second output terminal, and comprising a first coil which is composed of a plurality of coils connected together in series between said first input terminal and said first output terminal, a second coil which is composed of a plurality of coils connected together in series between said second input terminal and said second output terminal, and a plurality of first capacitors connected between said first coil and said second coil;

said first and second coils being wound around respective wrap sections of a first ferrite drum core, said respective wrap sections being separated from each other by a central wrap section of said first ferrite drum core, and said plurality of first capacitors being enclosed in a first base which supports said first ferrite drum core;

said first and second coils and said plurality of capacitors being covered with a first shield case, thereby constituting a balance type low pass filter of said receiving section;

said low pass filter of said sending section having a third input terminal, a third output terminal, a fourth input terminal and a fourth output terminal, and comprising a third coil which is composed of a plurality of coils connected together in series between said third input terminal and said third output terminal, a fourth coil which is composed of a plurality of coils connected together in series between said fourth input terminal and said fourth output terminal, and a plurality of second capacitors connected between said third and fourth coils;

said third and fourth coils being wound around respective wrap sections of a second ferrite drum core, and said respective wrap sections being separated from each other by a central wrap section of said second ferrite drum core;

said plurality of second capacitors being enclosed in a second base which supports said second drum core;

said third and fourth coils and said plurality of second capacitors being covered with a second shield case, thereby constituting a balance type low pass filter of said sending section;

said isolation transformer and said common mode choke transformer of said receiving section comprising a first toroidal core of said isolation transformer, a second toroidal core of said common mode choke transformer, and a third base having a plurality of terminals;

said first and second toroidal cores being stacked on said third base and being attached thereto, and said isolation transformer and said common mode choke transformer of said receiving section being connected through respective terminals of said third base to be integrated together;

said isolation transformer and said common mode choke transformer of said sending section comprising a third toroidal core of said isolation transformer, a fourth toroidal core of said common mode choke transformer, and a fourth base having terminals;

said third and fourth toroidal cores being stacked on said fourth base and being attached thereto, and said isolation transformer and said common mode choke transformer of said sending section being connected through respective terminals of said fourth base and integrated together; and said low pass filter of said receiving section, said isolation transformer and said common mode choke transformer of said receiving section, said low pass filter of said sending section and said isolation transformer and said common mode choke transformer of said sending section being provided on said circuit board of said interface module, with said receiving section and said sending section being separated from each other, thereby providing said receiving section and said sending section independently on said circuit board of said interface module.

11. An interface module of claim 10, wherein said isolation transformer and said common mode choke transformer of said receiving section, and said isolation transformer and said common mode choke transformer of said sending section are provided between said low pass filter of said receiving section and said low pass filter of said sending section on said circuit board of said interface module.

\* \* \* \* \*